(12) United States Patent
Behringer et al.

(10) Patent No.: US 12,094,916 B2
(45) Date of Patent: Sep. 17, 2024

(54) OPTOELECTRONIC SEMICONDUCTOR CHIP AND METHOD FOR PRODUCING THE SAME

(71) Applicant: OSRAM Opto Semiconductors GmbH, Regensburg (DE)

(72) Inventors: Martin Rudolf Behringer, Regensburg (DE); Tansen Varghese, Regensburg (DE); Alvaro Gomez-Iglesias, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 490 days.

(21) Appl. No.: 17/310,394

(22) PCT Filed: Jan. 23, 2020

(86) PCT No.: PCT/EP2020/051619
§ 371 (c)(1),
(2) Date: Jul. 30, 2021

(87) PCT Pub. No.: WO2020/156922
PCT Pub. Date: Aug. 6, 2020

(65) Prior Publication Data
US 2022/0020811 A1    Jan. 20, 2022

(30) Foreign Application Priority Data

Jan. 31, 2019 (DE) .................. 102019102489.7

(51) Int. Cl.
*H01L 27/15* (2006.01)
*H01L 25/18* (2023.01)
(52) U.S. Cl.
CPC .......... *H01L 27/156* (2013.01); *H01L 25/18* (2013.01)

(58) Field of Classification Search
CPC ........ H01L 27/156; H01L 25/18; H01L 33/06
See application file for complete search history.

(56) References Cited

U.S. PATENT DOCUMENTS

| 2014/0299892 A1* | 10/2014 | Oksanen ............. H01L 33/0008 257/79 |
| 2018/0013042 A1 | 1/2018 | Yoo et al. |
| 2019/0019899 A1* | 1/2019 | Wang ................. H01L 31/02 |

FOREIGN PATENT DOCUMENTS

| DE | 3005956 A1 | 9/1981 |
| DE | 102014112551 A1 | 3/2016 |

(Continued)

OTHER PUBLICATIONS

International Search Report (with English Translation) and Written Opinion in corresponding International Application No. PCT/EP2020/051619 mailed on Apr. 8, 2020, 12 pages.

(Continued)

*Primary Examiner* — Christine A Enad
(74) *Attorney, Agent, or Firm* — MH2 Technology Law Group LLP

(57) ABSTRACT

In at least one embodiment, the optoelectronic semiconductor chip comprises a semiconducting recombination layer for generating electromagnetic radiation by charge carrier recombination, a plurality of first contact elements on a first side of the recombination layer, at least one second contact element on the first side of the recombination layer, a plurality of semiconducting first connection regions, and at least one semiconducting second connection region. Each of the first connection regions is arranged between a first contact element and the first side of the recombination layer. The second connection region is arranged between the second contact element and the first side of the recombination layer. The first connection regions comprise a first type of doping and the second connection region comprises a (Continued)

second type of doping complementary to the first type of doping. The first contact elements are individually and independently electrically contactable.

13 Claims, 7 Drawing Sheets

(56) References Cited

FOREIGN PATENT DOCUMENTS

EP 0236189 A1 9/1987
EP 2748868 A1 7/2014

OTHER PUBLICATIONS

Lee, M. et al., "Planar GaN-Based Blue Ligth- Emitting Diodes With Surface p-n Junction Formed by Selective-Area Si-Ion Implantation", IEEE Transactions on Electron Devices, vol. 64, No. 10, Oct. 2017, pp. 4156-4160.
Riuttanen, L. et al., "Electrical injection to contactless near-surface InGaN quantum well", Applied Physics Letters 107, 051106, 2015, 7 pages.
Kivisaari, P. et al., "Elimination of Lateral Resistance and Current Crowding in Large-Area LEDs by Composition Grading and Diffusion-Driven Charge Transport", Advance Electronic Materials, vol. 3, No. 1700103, 2017, 3 pages.
Unknown, "GaxIn1—xP Electrical properties", Electrical Properties of Gallium Indium Phosphide (GaInP), http://www.ioffe.ru/SVA/NSM/Semicond/GaInP/electric.html#Basic, Accessed Jul. 27, 2021, 4 pages.

* cited by examiner

OPTOELECTRONIC SEMICONDUCTOR CHIP AND METHOD FOR PRODUCING THE SAME

CROSS-REFERENCE TO RELATED APPLICATIONS

This patent application is a national stage entry from International Application No. PCT/EP2020/051619, filed on Jan. 23, 2020, published as International Publication No. WO 2020/156922 A1 on Aug. 6, 2020, and claims priority under 35 U.S.C. § 119 from German patent application 10 2019 102 489.7, filed Jan. 31, 2019, the entire contents of all of which are incorporated by reference herein.

FIELD

An optoelectronic semiconductor chip, an optoelectronic component and a method for producing an optoelectronic semiconductor chip are specified.

BACKGROUND

A task to be solved is to specify an optoelectronic semiconductor chip with which a high-resolution display can be realized. Another task to be solved is to specify an optoelectronic component with such an optoelectronic semiconductor chip and a method for producing such an optoelectronic semiconductor chip.

These tasks are solved inter alia by the subject matter and the method of the independent patent claims as well as of the subordinate patent claim 12. Advantageous embodiments and further developments are the subject matter of the dependent patent claims.

SUMMARY

First, the optoelectronic semiconductor chip is specified.

According to at least one embodiment, the optoelectronic semiconductor chip comprises a semiconducting recombination layer. In particular, the recombination layer is configured to generate electromagnetic radiation by recombination of charge carriers. For this purpose, the recombination layer preferably comprises at least one quantum well in the form of a 2D quantum well or 1D quantum well or 0D quantum well. Viewed in a growth direction of the recombination layer, barrier layers that comprise a larger band gap than the quantum well are preferably arranged before and after the quantum well. For example, the recombination layer comprises a plurality of 2D quantum wells arranged one above the other in the growth direction, each separated by such a barrier layer.

For example, the recombination layer comprises a thickness of at most 300 nm or at most 200 nm. Alternatively or additionally, the thickness of the recombination layer may be at least 1 nm or at least 2 nm. The recombination layer is preferably undoped.

The above values for the thickness of the recombination layer may apply to a plane-parallel layer or to a minimum thickness. If the recombination layer comprises optical elements such as microlenses, for example with focus on emission points and/or on the quantum wells, or such as curved mirrors, again in particular with focus points at the emission points and/or at the quantum wells, the recombination layer can be thicker. For example, the maximum thickness of the recombination layer together with the optical elements preferably designed integrally with the recombination layer is at most 5 μm or 2 μm or 1 μm.

By a semiconducting layer is understood here and in the following in particular as a layer of a semiconductor material. The semiconductor material is, for example, a III-V compound semiconductor material. The semiconductor material is, for example, a nitride compound semiconductor material, such as $Al_nIn_{1-n-m}Ga_mN$, or a phosphide compound semiconductor material, such as $Al_nIn_{1-n-m}Ga_mP$, or an arsenide compound semiconductor material, such as $Al_nIn_{1-n-m}Ga_mAs$ or $Al_nIn_{1-n-m}Ga_mAsP$, wherein $0 \leq n \leq 1$, $0 \leq m \leq 1$, and $m+n \leq 1$, respectively. In this context, a semiconducting layer may comprise dopants as well as additional components. For simplicity, however, only the essential constituents of the crystal lattice of the semiconducting layer, i.e., Al, As, Ga, In, N, or P, are specified, even though these may be partially replaced and/or supplemented by small amounts of additional substances.

A semiconductor chip is understood here and in the following to be a separately manageable and electrically contactable element. A semiconductor chip is produced in particular by separation from a wafer composite. Side surfaces of such a semiconductor chip then comprise, for example, traces from the separation process of the wafer composite. A semiconductor chip preferably comprises exactly one originally contiguous region of a semiconductor layer sequence grown in the wafer composite. The maximum lateral extent of the semiconductor chip is, for example, at most 5% or at most 10% or at most 20% larger than the maximum lateral extent of the recombination layer.

Here and hereinafter, a lateral extent is understood as an extent along a lateral direction. A lateral direction is a direction parallel to the main extension plane of the recombination layer.

According to at least one embodiment, the optoelectronic semiconductor chip comprises a plurality of first contact elements on a first side of the recombination layer. The first side of the recombination layer is a main side of the recombination layer. Preferably, the main side is parallel or substantially parallel to a main extension plane of the recombination layer. The first side may be planar within the manufacturing tolerance.

For example, the first contact elements are arranged in a regular pattern, for example in a rectangular pattern or a hexagonal pattern, on the first side. In particular, the first contact elements are spaced apart and separated from each other. For example, the first contact elements each comprise a maximum lateral extent, measured parallel to the main extension plane of the recombination layer, of at most 20 μm or at most 10 μm or at most 5 μm. Alternatively or additionally, the first contact elements may comprise a minimum lateral extent of at least 0.2 μm or at least 0.5 μm.

Viewed from above on the first side, the first contact elements comprise, for example, a square or rectangular or hexagonal shape. A distance between two adjacent first contact elements is, for example, at least 0.05 μm or at least 0.1 μm. Alternatively or additionally, the distance may be at most 10 μm or at most 5 μm or at most 1 μm. The semiconductor chip comprises, for example, at least four or at least ten or at least 100 first contact elements.

The first contact elements preferably comprise or consist of a metal, such as Ag, Pt, Au, Pd, Ti. Alternatively or additionally, the first contact elements may comprise or consist of a transparent conductive oxide, abbreviated TCO, such as indium tin oxide, abbreviated ITO, or zinc oxide.

According to at least one embodiment, the optoelectronic semiconductor chip comprises at least one second contact element on the first side of the recombination layer. Thereby, the optoelectronic semiconductor chip may comprise exactly one second contact element or a plurality of second contact elements. All specifications made here and in the following with respect to a second contact element may apply accordingly to all further second contact elements.

The second contact element is arranged in lateral direction, parallel to the main extension plane of the recombination layer, preferably between two first contact elements. Thereby, the second contact element is spaced and separated from the first contact elements. The second contact element may comprise or consist of the same materials as the first contact elements.

In particular, the second contact element comprises a polarity opposite to the first contact elements in the intended operation of the semiconductor chip. For example, the first contact elements are anodes and the second contact element is a cathode, or vice versa. The first contact elements and the second contact element serve in particular for electrical contacting of the semiconductor chip. In the unmounted state of the semiconductor chip, the contact elements are exposed or freely accessible, for example. The contact elements may each be formed in one piece.

According to at least one embodiment, the optoelectronic semiconductor chip comprises a plurality of semiconducting first connection regions. The first connection regions may be separated, spaced-apart elements made of a semiconductor material. Alternatively, the first connection regions may be spaced apart and non-overlapping regions of a continuous semiconductor layer.

According to at least one embodiment, the optoelectronic semiconductor chip comprises at least one semiconducting second connection region. The semiconductor chip may comprise exactly one semiconducting second connection region or a plurality of semiconducting second connection regions. All specifications made here and in the following with respect to one second connection region may apply accordingly to all other second connection regions.

According to at least one embodiment, the first connection regions are each arranged between a first contact element and the first side of the recombination layer. In particular, each first contact element is biuniquely assigned a first connection region which is located between this first contact element and the first side of the recombination layer.

Preferably, when viewed in a plan view, the first contact elements and the associated first connection regions each overlap with each other. Preferably, when viewed in a top view, the first contact elements each overlap only with the associated first connection region. In particular, in the plan view, the first contact elements can each lie completely within an outer contour of the first connection regions. The first connection regions may be in direct contact with the associated first contact elements and/or the first side of the recombination layer.

An average thickness of the first connection regions, measured perpendicular to the main extension plane of the recombination layer, is, for example, at most 1 μm or at most 500 nm or at most 200 nm in each case. Alternatively or additionally, the average thickness of the first connection regions may be at least 10 nm or at least 50 nm or at least 100 nm, respectively.

According to at least one embodiment, the second connection region is arranged between the second contact element and the first side of the recombination layer. Viewed in a top view, the second connection region and the second contact element preferably overlap with each other. Preferably, the second contact element overlaps only with the associated second connection region. In particular, in this top view, the second connection region may comprise substantially the same shape, for example a concentric shape, as the second contact element. For example, in the top view, the second contact element lies entirely within an outer contour of the second connection region. The second connection region may be in direct contact with the second contact element and/or the first side of the recombination layer. The thickness of the second connection region may comprise the thicknesses specified for the first connection regions.

According to at least one embodiment, the first connection regions comprise a first type of doping and the second connection region comprises a second type of doping complementary to the first type of doping. For example, if the first connection regions are p-doped, the second connection region is n-doped or vice versa. In particular, the dopants are selected according to the polarity of the contact elements. Thus, if the first contact elements are anodes and the second contact element is a cathode, the first connection regions are preferably p-doped and the second connection region is n-doped.

A doping concentration in the first and second connection regions is, for example, at least $0.5 \cdot 10^{17}$ cm$^{-3}$ or at least $1 \cdot 10^{17}$ cm$^{-3}$ or at least $1 \cdot 10^{18}$ cm$^{-3}$ or at least $5 \cdot 10^{18}$ cm$^{-3}$. Preferably, for the case of p-doping, the doping concentration is at least $1 \cdot 10^{17}$ cm$^{-3}$ and, in the case of n-doping, the doping concentration is at least $1 \cdot 10^{18}$ cm$^{-3}$. Specifications made here and in the following regarding the doping concentration of a region or an element or a layer refer in particular to doping concentrations averaged over the entire extent of the region or the element or the layer.

In particular, the connection regions effect an electrical connection to the contact elements, which are preferably adapted to metal, with a low ohmic contact resistance. This enables an injection of charge carriers from the contact elements into the semiconductor material. The connection regions are arranged like the contact elements on the first side of the recombination layer.

That the first contact elements and the second contact element and the associated semiconducting connection regions are arranged on the first side of the recombination layer means that all these elements are arranged on the same side of the recombination layer. In other words, the regions of the recombination layer in which radiative charge carrier recombination takes place during intended operation are arranged downstream of the first contact elements, the second contact element as well as the connection regions in the same direction. Particularly preferably, the semiconductor chip is free of recesses with electrically conductive vias extending through the recombination layer. Neither the first nor the second contact elements nor the associated connection regions thus penetrate the recombination layer.

According to at least one embodiment, the first contact elements are individually and independently electrically contactable or energizable. This means that the first contact elements are not directly electrically conductively connected to one another. In intended operation, charge carriers can pass from a first contact element to a further first contact element, for example, only via a detour via first connection regions.

In the intended operation of the semiconductor chip, first charge carriers are injected into the first connection regions via the first contact elements and second charge carriers are injected into the second connection region via the second contact element. For example, the first charge carriers are holes and the second charge carriers are electrons or vice versa. Subsequently, both the first and second charge carriers exit the connection regions via the first side into the recombination layer and recombine there, generating electromagnetic radiation. This electromagnetic radiation is then preferably coupled out of the recombination layer via a second side of the recombination layer opposite the first side. After injection of the first and second charge carriers, both types of charge carriers preferentially diffuse toward each other away from the first side toward the second side of the recombination layer.

Preferably, no contact elements are arranged on the second side of the recombination layer. For example, during intended operation of the semiconductor chip, at least 75% or at least 90% of the radiation generated in the recombination layer exits the recombination layer via the second side. To effectively couple out the radiation via the second side, a mirror layer may be arranged on the first side.

In at least one embodiment, the optoelectronic semiconductor chip includes a semiconducting recombination layer for generating electromagnetic radiation by charge carrier recombination, a plurality of first contact elements on a first side of the recombination layer, at least one second contact element on the first side of the recombination layer, a plurality of semiconducting first connection regions, and at least one semiconducting second connection region. Each of the first connection regions is arranged between a first contact element and the first side of the recombination layer. The second connection region is arranged between the second contact element and the first side of the recombination layer. The first connection regions comprise a first type of doping and the second connection region comprises a second type of doping complementary to the first type of doping. The first contact elements can be electrically contacted individually and independently of each other.

In particular, the present invention is based on the idea of realizing a pixelated optoelectronic semiconductor chip in which the injection of charge carriers into the recombination layer, which is often also referred to as the active layer, does not occur from two opposite sides of the recombination layer, but via the same first side. That is, in the semiconductor chip, the first charge carriers and the second charge carriers are injected into the recombination layer from the same side. In this case, the charge carrier transport to the recombination layer occurs in particular due to diffusion. The papers "*Elimination of Lateral Resistance and Current Crowding in Large-Area LEDs by Composition Grading and Diffusion-Driven Charge Transport*" by Pyry Kivisaari et al, Adv. Electron. Mater. 2017, 3, 1700103 and "*Electrical injection to contactless near-surface InGaN quantum well*" by L. Riuttanen et al, Applied Physics Letters 107, 051106 (2015) demonstrate the fundamental operating principle of optoelectronic semiconductor chips in which charge carrier transport is via diffusion. The disclosure content of these papers is hereby incorporated by reference.

A particular advantage of such an optoelectronic semiconductor chip is that no recesses with vias through the recombination layer are required to implement the semiconductor chip. Such vias are usually used to guide charge carriers from the first side of the recombination layer to the second side of the recombination layer and then to inject them into the recombination layer via the second side. However, undesirable effects, such as non-radiative recombination, can occur in the vicinity of these vias. For very small pixel sizes or pixel pitches, such undesirable effects can lead to a significant loss of efficiency.

With the present invention, a pixelated semiconductor chip is realized in which even small pixels, for example with a pixel pitch or pixel spacing of at most 10 μm, can be realized without loss of efficiency due to vias.

According to at least one embodiment, the optoelectronic semiconductor chip is a pixelated semiconductor chip with a plurality of individually and independently controllable pixels. In this case, a first contact element is uniquely, in particular biuniquely, assigned to each pixel. Pixels are also referred to as emission zones. When a pixel is driven, electromagnetic radiation is generated in the region of this pixel. Individually and independently controllable pixels are realized in particular by the fact that the first contact elements can be electrically contacted or energized individually and independently of one another.

If a particular pixel is driven, first charge carriers are supplied to the associated first contact element, which then recombine with the second charge carriers in the recombination layer. Electromagnetic radiation then exits the recombination layer only in an emission region of the second side of the recombination layer associated with the pixel. For example, the emission region associated with a pixel is substantially defined by the projection of the first contact element associated with the pixel onto the second side. In particular, due to a low mobility of the first charge carriers, the recombination of charge carriers may be limited to the region of the recombination layer close below the associated first contact element.

A converter layer may be arranged on the second side of the recombination layer. The converter layer converts radiation generated in the recombination layer into radiation of a longer wavelength. For example, the semiconductor chip emits white light during operation. The converter layer may be patterned to increase the contrast ratio and may include a plurality of elements, each of which has a trench adapted between them. Each pixel may be biuniquely associated with an element of the converter layer.

A pixelated semiconductor chip described herein may be used, for example, in headlights of a motor vehicle.

According to at least one embodiment, the recombination layer is adapted to be simply connected in the region of a pixel. That is, in the region of a pixel, the recombination layer is free of interruptions, such as holes. Preferably, the recombination layer is adapted to be simply connected in a region extending over a plurality of pixels. Particularly preferably, the entire recombination layer is adapted to be simply connected, i.e. free of interruptions or holes.

According to at least one embodiment, the first connection regions are portions of a continuous, in particular simply connected, first semiconductor layer. The first semiconductor layer preferably extends over several, in particular over all pixels or first contact elements of the semiconductor chip. The first connection regions are then sections or regions of the first semiconductor layer provided with the doping of the first type. The first connection regions may be produced, for example, by implantation or diffusion of doping atoms of the first type. The first semiconductor layer may be epitaxially grown together with the recombination layer. In particular, the first semiconductor layer is arranged directly on the first side of the recombination layer.

According to at least one embodiment, the first semiconductor layer is undoped or comprises a second type of doping in regions between each of the two first connection regions. "Undoped" here means, for example, a doping concentration of at most $1 \cdot 10^{16}$ cm$^{-3}$ or at most $1 \cdot 10^{15}$ cm$^{-3}$. If the first semiconductor layer is provided with a doping of the second type outside the first connection regions, the doping concentration there is preferably at most $1 \cdot 10^{19}$ cm$^{-3}$ or at most $1 \cdot 10^{18}$ cm$^{-3}$ or at most $1 \cdot 10^{17}$ cm$^{-3}$. Thus, along the lateral direction, regions with the doping of the first type alternate with undoped regions or regions with doping of the second type in the first semiconductor layer.

For example, doping of the first semiconductor layer occurs during growth, by diffusion and/or by ion implantation. It is possible that both at least one n-type dopant and at least one p-type dopant are introduced into an intrinsically doped grown semiconductor layer, in particular by means of diffusion. In this way, a voltage drop can be reduced. That is, the first semiconductor region can be p- and n-codoped.

By realizing the first connection regions as regions of a continuous first semiconductor layer, the first connection regions can be produced in a simplified manner. In particular, no patterning processes or sequential growth processes need to be used to realize the first connection regions, which could again cause sources of non-radiative recombination.

The first semiconductor layer preferably extends between the recombination layer and the second connection region in the region of the second connection region. In this case, the second connection region may be directly adjacent to the first semiconductor layer. In the region between the second connection region and the recombination layer, the first semiconductor layer is preferably provided with the doping of the second type to facilitate the transport of the second charge carriers from the second connection region to the recombination layer. However, the doping concentration is preferably smaller, for example by a factor of at least 10 or at least 100 smaller, than in the second connection region.

In regions of the first semiconductor layer which, viewed along the lateral direction, lie between the first contact elements and the second contact element, the first semiconductor layer may comprise a doping of a first type with a lower doping concentration than in the region between the second connection region and the recombination layer, or may be undoped there. Thus, a recombination of charge carriers can already be reduced in the first semiconductor layer.

Alternatively, it is also possible that the first semiconductor layer is interrupted in regions that lie in the lateral direction between the first connection regions and the second connection region. In this case, the first semiconductor layer is not adapted to be continuous, but is structured. All the features of the continuous first semiconductor layer mentioned before and below may also apply to the patterned first semiconductor layer.

According to at least one embodiment, a band gap in the first semiconductor layer is larger than in the recombination layer. In particular, the band gap of the first semiconductor layer is larger than in the recombination layer by at least 0.05 eV or at least 0.1 eV. In this context, the band gap of the first semiconductor layer and of the recombination layer is understood to be in each case the band gap averaged over the entire layer or, alternatively, the lowest band gap.

By choosing the first semiconductor layer with a larger band gap than in the recombination layer, the probability of recombination of the first and second charge carriers in the first semiconductor layer is reduced. As a result, the efficiency of charge carrier diffusion up to the recombination layer is increased.

According to at least one embodiment, the first connection regions are spaced apart and separate from each other. Thus, in the lateral direction, an intermediate space is formed between each two first connection regions, which is at least partially free of semiconductor material. Seen in lateral direction, the second connection region can be arranged between each of the two first connection regions. Preferably, both the first connection regions and the second connection region are then directly adjacent to the recombination layer.

In this embodiment, the first connection regions are not realized by a continuous first semiconductor layer. This reduces the risk of recombination of the charge carriers outside the recombination layer. The first connection regions and the second connection region may be produced, for example, via selective area growth.

According to at least one embodiment, the second contact element is adapted to be contiguous and penetrated by a plurality of holes, wherein, as viewed in a plan view, the first contact elements are each arranged in one such hole. In particular, each hole in the second contact element is biuniquely associated with a first contact element. In other words, viewed in a plan view, the second contact element forms a mesh of a plurality of meshes, wherein each mesh laterally surrounds a first contact element. The meshes are, for example, rectangular, square, or hexagonal. For example, a width of the meshes is between 0.1 µm and 1 µm, inclusive. For example, in this case there is only a single second contact element that forms a common counter contact element to the first contact elements. When driving a pixel, the second contact element and the first contact element associated with the pixel are contacted.

Like the second contact element, the second connection region may be formed contiguously with a plurality of holes and substantially follow the shape of the second contact element.

According to at least one embodiment, the semiconductor chip comprises a plurality of second contact elements. The second contact elements are then preferably spaced apart and separated from each other. The second contact elements may be individually and independently electrically contactable. The shapes and sizes of the second contact elements may be selected in the same manner as the shapes and sizes of the first contact elements disclosed above. The semiconductor chip may also comprise a plurality of spaced-apart, semiconducting second connection regions. Each second contact element is then preferably biuniquely associated with a second connection region.

According to at least one embodiment, the first and second contact elements are arranged alternately in a lateral direction on the first side. Thus, a second contact element is arranged between each of the two first contact elements. The assembly of the first and second contact elements may follow a checkerboard pattern. In particular, a first and a second contact element arranged directly next to it are each uniquely assigned to a pixel. To drive a pixel, the associated first contact element and the associated second contact element are contacted. Radiation generation within the recombination layer then occurs in particular in the region of the recombination layer that lies in the lateral direction between the driven first contact element and the driven second contact element.

In the embodiment with a plurality of second contact elements, the pixel pitch or the pixel spacing of adjacent pixels can be further reduced compared to the case with only a single second contact element without changing the size of the first contact elements or the spacing between the first contact elements and the second contact elements.

According to at least one embodiment, the recombination layer comprises a plurality of 0-dimensional quantum wells, so-called quantum dots. The quantum dots may be arranged side by side in a plane parallel to the main extension plane of the recombination layer. Also, the recombination layer may comprise multiple stacked planes parallel to the main extension plane of the recombination layer, each with a plurality of quantum dots within those planes. The different planes of quantum dots are then preferably separated from each other by barrier layers.

By choosing quantum dots as recombination centers in the recombination layer, the locations of recombination and thus the pixel shapes can be specified even more precisely.

According to at least one embodiment, the recombination layer comprises a patterning and/or a variation in structure along a lateral direction. In particular, a contrast ratio between adjacent pixels is thereby increased. For example, the recombination layer can be interrupted or provided with trenches in the region between each of the two adjacent pixels or between each of the two adjacent first contact elements. Then, no charge carrier recombination takes place in the region between two pixels.

Preferably, however, only the structure of the recombination layer in the region between each of two adjacent pixels or between each of the two adjacent first contact elements is selected differently than in the region of the pixels or the first contact elements, without the recombination layer being interrupted in places or provided with trenches. This avoids the risk of non-radiative recombination. In particular, the structure is such that the probability of charge carrier recombination in the region between each of the two pixels is lower than in the region of the pixels themselves. For this purpose, the recombination layer in the region between each of the two pixels can be free of quantum wells or comprise a lower density of quantum wells than in the region of the pixels. The band gap of a quantum well can also be set smaller in the region of the pixels than in the region between the pixels.

Such a variation in the structure can already be set during the growth of the recombination layer. Alternatively, however, the recombination layer can also be processed after growth, for example by implantation or diffusion.

According to at least one embodiment, dividing walls are arranged on a second side of the recombination layer opposite the first side in the region between each of the two first contact elements or pixels. The dividing walls serve in particular to reduce optical crosstalk between adjacent pixels. The dividing walls are preferably reflective for the radiation generated in the recombination layer. The dividing walls may form a mesh of multiple meshes when viewed from the top of the second side, wherein each mesh is preferably biuniquely associated with a pixel. For example, the projection area of the first contact element associated with a pixel onto the second side is mostly or entirely within the associated mesh of dividing walls, respectively. The dividing walls may each comprise a height, measured perpendicular to the main extension plane of the recombination layer, of at least 500 nm or at least 1 μm. The dividing walls may narrow in the direction toward the recombination layer. The dividing walls may comprise reflective particles, such as $TiO_2$ particles.

According to at least one embodiment, a second semiconductor layer is arranged on the second side of the recombination layer, for example directly on the second side. The second semiconductor layer may be grown together with the recombination layer. Preferably, the band gap in the second semiconductor layer is larger than that in the recombination layer. Preferably, the second semiconductor layer is undoped.

According to at least one embodiment, the dividing walls are formed of the second semiconductor layer. In this case, a recess in the second semiconductor layer is associated, in particular biuniquely associated, with each first contact element. The recesses are each surrounded, in particular completely surrounded, by the dividing walls in the lateral direction. The recesses can be etched into the second semiconductor layer, for example. The recesses may be filled with a material, for example a silicone-based material.

Alternatively or in addition to the recesses and dividing walls, the second semiconductor layer may comprise a roughening to reduce total reflection.

Further, a photonic crystal layer and/or an anti-reflection layer may be arranged on the second side of the recombination layer. Preferably, a barrier layer with a thickness of at most 100 nm is arranged between the photonic-crystal layer and the recombination layer.

Next, the optoelectronic component is specified.

According to at least one embodiment, the optoelectronic component comprises an optoelectronic semiconductor chip according to one or more of the previously described embodiments.

According to at least one embodiment, the optoelectronic component comprises a carrier, wherein the optoelectronic semiconductor chip is mounted and fixed to the carrier. For example, the carrier forms the component of the device which stabilizes the optoelectronic component. For example, the optoelectronic semiconductor chip alone is not self-supporting. A growth substrate for the semiconductor layers of the semiconductor chip is removed, for example. The carrier may be a metallic carrier or a semiconductor carrier or a ceramic carrier.

According to at least one embodiment, the optoelectronic semiconductor chip is electrically contacted via the carrier. For example, the carrier comprises first contact points and at least one second contact point for this purpose, wherein the first contact points are electrically conductively connected with the first contact elements and the at least one second contact point is electrically conductively connected with the at least one second contact element. Preferably, the carrier thus comprises a first contact point for each first contact element and a second contact point for each second contact element.

According to at least one embodiment, the carrier comprises a plurality of switches. In particular, the switches are integrated into the carrier. The switches may be transistors, in particular thin film transistors. The carrier may comprise a user-specific integrated circuit, or ASIC for short. The carrier may be an active matrix element.

According to at least one embodiment, a switch is assigned to each first contact element or pixel, in particular biuniquely assigned. The assigned first contact element or the assigned pixel can be controlled via the switch. Furthermore, in the case of a plurality of second contact elements, a switch can also be assigned, in particular biuniquely assigned, to each second contact element.

Next, the method for producing an optoelectronic semiconductor chip is specified. The method is particularly suitable for producing an optoelectronic semiconductor chip as just described. All features disclosed in connection with the optoelectronic semiconductor chip are therefore also disclosed for the method, and vice versa.

According to at least one embodiment, the method comprises a step A) in which a semiconducting recombination layer is provided. The recombination layer may, for example, be part of a semiconductor layer sequence epitaxially grown on a growth substrate, such as a Si substrate, GaAs substrate, GaN substrate or sapphire substrate.

According to at least one embodiment, the method comprises a step B) in which a plurality of semiconducting first connection regions and at least one semiconducting second connection region are formed on a first side of the recombination layer. In this process, the first connection regions comprise a doping of a first type and the second connection region comprises a doping of a second type complementary to the doping of the first type.

According to at least one embodiment, the method comprises a step C) in which a plurality of first contact elements and at least one second contact element are applied to the first side of the recombination layer. The contact elements are applied such that the first connection regions are each arranged between a first contact element and the first side of the recombination layer, and the second connection region is arranged between the second contact element and the first side of the recombination layer.

Preferably, steps A) to C) are carried out in the order indicated and in succession.

According to at least one embodiment, a semiconductor layer sequence comprising the recombination layer and a first semiconductor layer on the first side of the recombination layer is first provided in step A). The first semiconductor layer is undoped or comprises a doping of a second type.

According to at least one embodiment, in step B) the first semiconductor layer is doped locally so that the first connection regions with a doping of the first type are formed from the first semiconductor layer. For this purpose, doping atoms of the first type can, for example, be introduced into the first semiconductor layer locally via diffusion or implantation where the first connection regions are to be formed.

According to at least one embodiment, a semiconductor layer sequence comprising the recombination layer and a third semiconductor layer on the first side of the recombination layer is first provided in step A). The first semiconductor layer is preferably arranged between the recombination layer and the third semiconductor layer. The third semiconductor layer may be arranged directly on the first semiconductor layer.

According to at least one embodiment, the third semiconductor layer comprises a doping of a second type. The doping of the third semiconductor layer may be adjusted, for example, already during the growth process. For example, the doping concentration in the third semiconductor layer is at least $1 \cdot 10^{18}$ cm$^{-3}$. In particular, the doping concentration of the third semiconductor layer in step A) already corresponds to the doping concentration provided for the second connection region. Preferably, the dopant concentration in the third semiconductor layer in step A) is larger, for example by a factor of at least 10 or at least 50 or at least 100, than the dopant concentration in the first semiconductor layer.

According to at least one embodiment, in step B) the third semiconductor layer is patterned such that in regions where the first connection regions are to be formed, the third semiconductor layer is removed and at least one second connection region remains from the third semiconductor layer. The structuring of the third semiconductor layer can be carried out, for example, by means of a lithography process.

Alternatively, however, the first connection regions and the one or more second connection regions may be formed by selective area growth. In this case, the position and size of the first and second connection regions, and preferably also their doping, are already predetermined during growth.

In the following, an optoelectronic semiconductor chip described herein, an optoelectronic component described herein, and a method for producing an optoelectronic semiconductor chip described herein are explained in more detail with reference to drawings based on exemplary embodiments. Identical reference signs thereby specify identical elements in the individual figures. However, no references to scale are shown; rather, individual elements may be shown exaggeratedly large for better understanding.

DETAILED DESCRIPTION

Figure 1A:
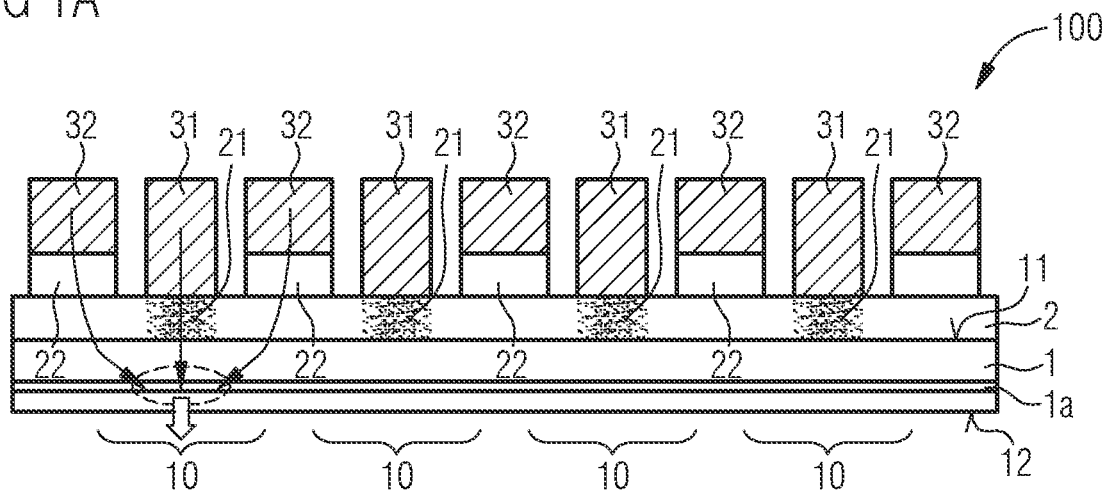
FIGS. 1A to 8 various exemplary embodiments of the optoelectronic semiconductor chip in different views, FIG. 9 an exemplary embodiment of the optoelectronic component, FIGS. 10A to 10E different positions in an exemplary embodiment of the method for producing an optoelectronic semiconductor chip.

In FIG. 1A, a first exemplary embodiment of the optoelectronic semiconductor chip 100 is shown in a lateral cross-sectional view. The semiconductor chip 100 includes a recombination layer 1 with a 2-dimensional quantum well 1a. The recombination layer 1 is based on a semiconductor material, for example GaAs. Barrier layers are arranged on both sides of the quantum well 1a. The recombination layer 1 is adapted to be simply connected, i.e. without interruptions or holes.

A first semiconductor layer 2 is arranged on a first side 11 of the recombination layer 1. In the present case, the first semiconductor layer 2 directly adjoins the recombination layer 1. The first semiconductor layer 2 is also adapted to be simply connected. The first semiconductor layer 2 is also based on GaAs, for example. The first semiconductor layer 2 comprises a plurality of spaced-apart first connection regions 21, in which the first semiconductor layer 2 is doped with a doping of a first type. In the present case, the doping of the first type is, for example, a p-type doping. The doping atoms may be Zn atoms. The doping concentration within the first connection regions 21 is, for example, at least $1 \cdot 10^{17}$ cm$^{-3}$.

In the region between each of the two first connection regions 21, the first semiconductor layer 2 is nominally undoped or comprises a doping of a second type complementary to the doping of the first type, i.e. n-doping in the present case. The doping concentration in the regions between the first connection regions 21 is, for example, at most $1 \cdot 10^{17}$ cm$^{-3}$.

First contact elements 31 and a second contact element 32 are arranged on the side of the first semiconductor layer 2 facing away from the recombination layer 1. The contact elements 31, 32 are formed of metal, for example. The first contact elements 31 can be electrically contacted or energized individually and independently of one another. The first contact elements 31 are arranged directly on the connection regions 21 and, viewed in a plan view, overlap with the first connection regions 21.

The second contact element 32 is arranged in the region between the first contact elements 31. Viewed in a top view, the second contact element 32 does not overlap with the first connection regions 21. A semiconducting second connection region 22 is arranged between the second contact element 32 and the first semiconductor layer 2. The second connection region 22 is also based on GaAs, for example. The second connection region 22 is provided with a doping of the second type, presently an n-doping. The doping concentration in the second connection region 22 is, for example, at least $1 \cdot 10^{18}$ cm$^{-3}$. The second contact element 32 is immediately adjacent to the second connection region 22.

Figure 1B:
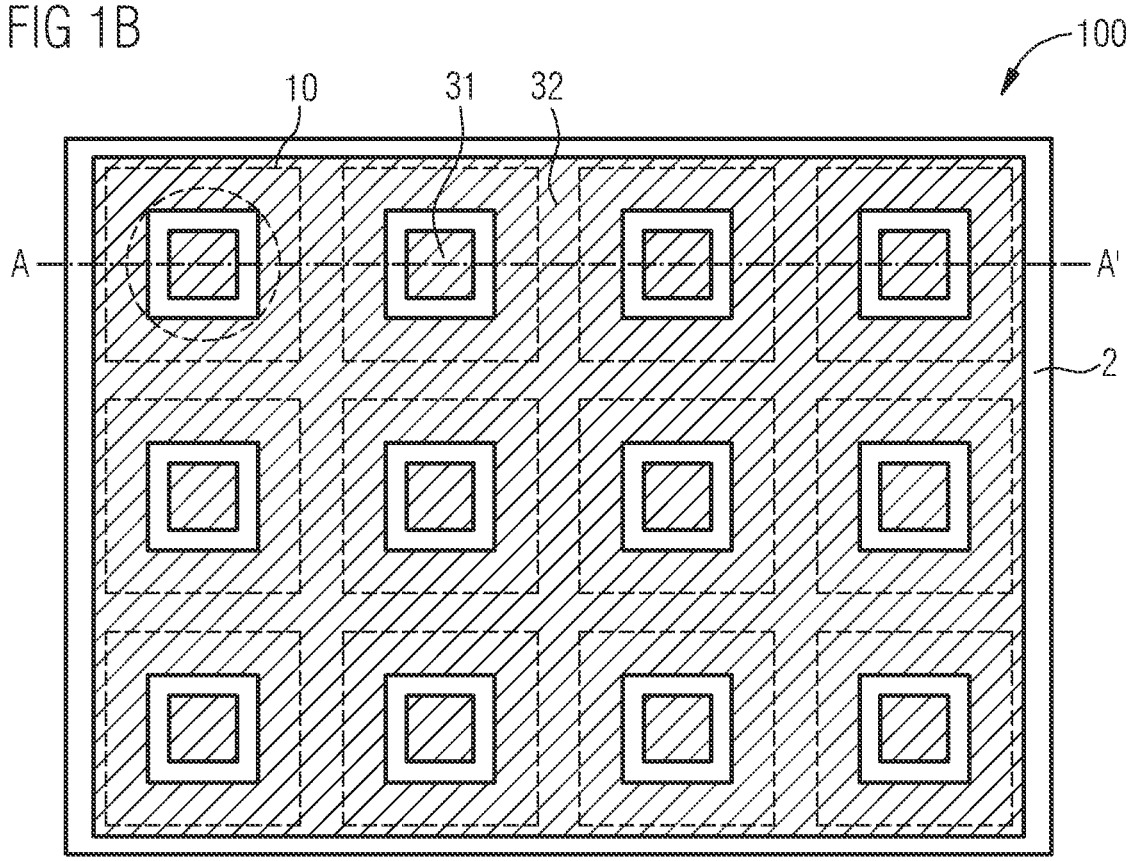

In FIG. 1B, the semiconductor chip 100 of FIG. 1A is shown in a top view of the contact side with the contact elements 31, 32. FIG. 1A is a cross-sectional view along section line AA' of FIG. 1B. The first contact elements 31 are spaced apart and not continuous. The second contact element 32 is adapted to be continuous and forms a network of rectangular meshes. Within the meshes, the first contact elements 31 are arranged spaced apart from the second contact element 32.

In FIGS. 1A and 1B, it can also be seen that the optoelectronic semiconductor chip 100 is a pixelated semiconductor chip with a plurality of pixels 10. The pixels 10 are individually and independently drivable. Thereby, a first contact element 31 is biuniquely assigned to each pixel 10. The second contact element 32 forms a common counter contact for all first contact elements 31. Contours of the pixels 10 are indicated as dashed rectangles in FIG. 1B.

In FIG. 1A, it is shown how the pixel 10 at the left edge of the semiconductor chip 100 is driven. First charge carriers, present in the form of holes, are supplied to the semiconductor chip 100 via the first contact element 31 assigned to the pixel 10. Second charge carriers in the form of electrons are supplied to the semiconductor chip 100 via the second contact element 32. The charge carriers are injected from the contact elements 31, 32 into the underlying doped connection regions 21, 22 and diffuse from there respectively via the first side 11 into the recombination layer 1. In the recombination layer 1, the charge carriers recombine in the region of the quantum well 1a and predominantly below the first contact element 31. This recombination region is shown in FIG. 1A by the dashed ellipse and in FIG. 1B by the dashed circle.

The recombination region is predominantly limited to the region below the first contact element 31, since the mobility of holes is usually lower than that of electrons. To prevent recombination of charge carriers from already occurring in the first semiconductor layer 2, the first semiconductor layer 2 may comprise, for example, a higher band gap than the recombination layer 1.

Radiation generated in the region of the pixel 10 is coupled out of the recombination layer 1 via a second side 12 of the recombination layer 1, which is opposite to the first side 11 of the recombination layer 1.

Figure 2:
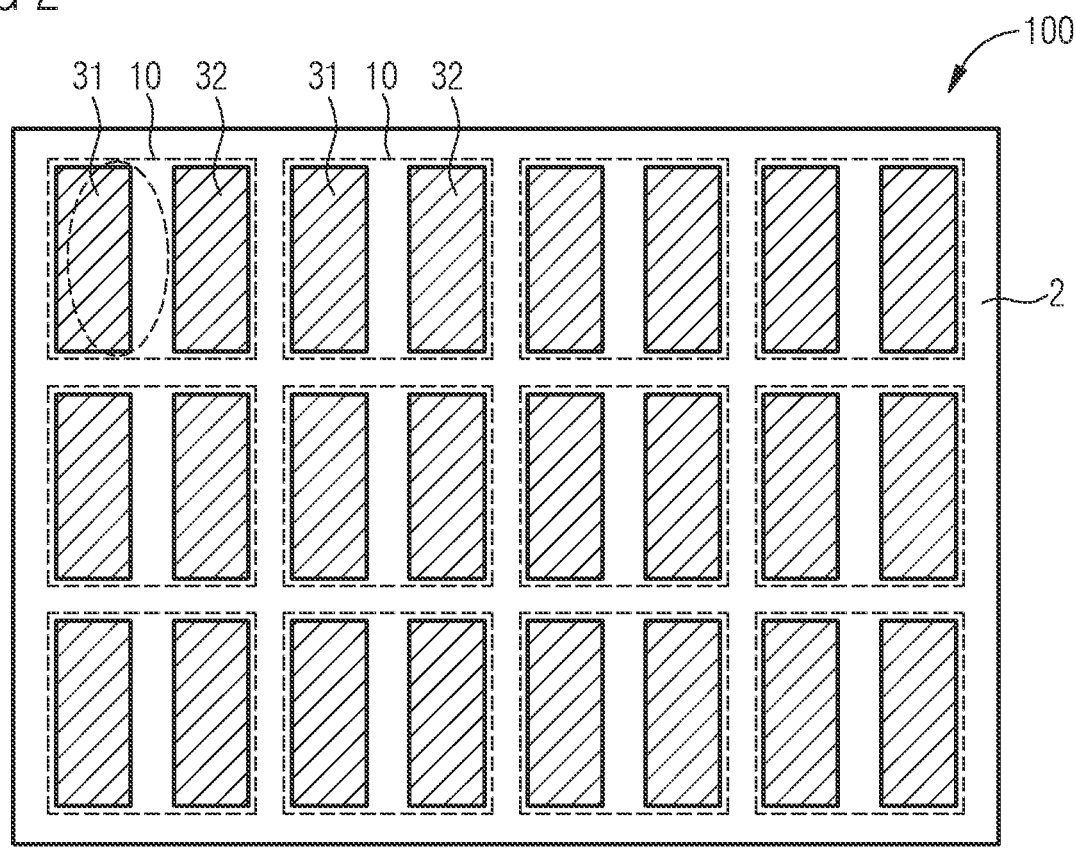

In FIG. 2, a second exemplary embodiment of the optoelectronic semiconductor chip 100 is again shown in plan view. In the case of FIG. 2, the semiconductor chip 100 comprises a plurality of second contact elements 32, with each second contact element 32 having a first contact element 31 associated therewith. Both the first contact elements 31 and the second contact elements 32 are individually and independently electrically contactable or energizable. Two contact elements 31, 32 assigned to each other are located directly next to each other and are each assigned to a pixel 10. When a pixel 10 is driven by energizing the associated first contact element 31 and the associated second contact element 32, the charge carriers within the recombination layer 1 recombine in the region between the first contact element 31 and the second contact element 32. The recombination region is shown in FIG. 2 by the dashed ellipse.

In all the now following exemplary embodiments, either a single second contact element 32 as in FIG. 1 or a plurality of second contact elements 32 as in FIG. 2 may be used.

Figure 3:
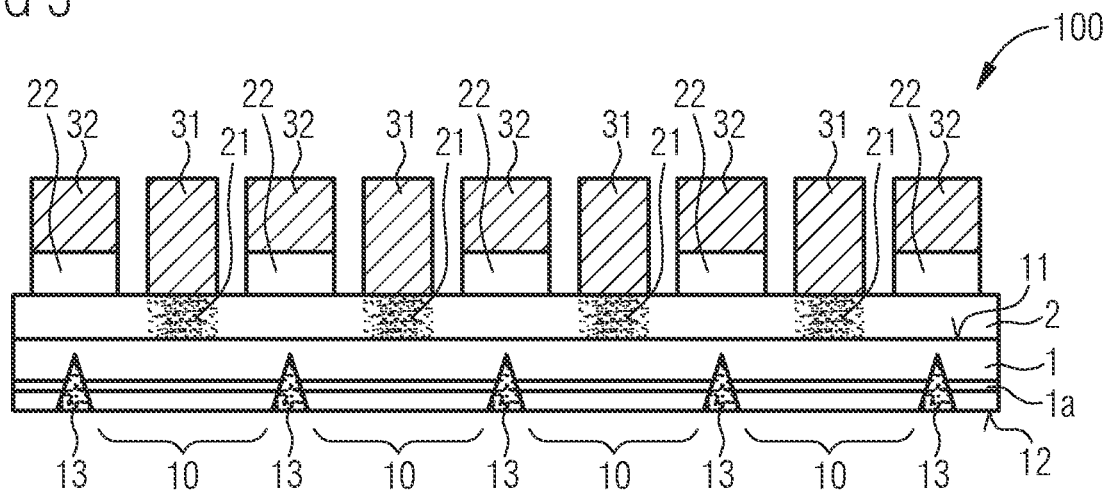

In FIG. 3, a third exemplary embodiment of the optoelectronic semiconductor chip 100 is again shown in cross-sectional view. Unlike the previous exemplary embodiments, the recombination layer 1 is now patterned or varied in structure along a lateral direction parallel to the main extension plane of the recombination layer 1. In particular, the recombination layer 1 is modified in regions 13 between each of the two adjacent first contact elements 31 and between each of the two adjacent pixels 10, respectively, such that in these regions 13 a recombination of charge carriers is suppressed with respect to all other regions of the recombination layer 1. For example, the regions 13 comprise trenches etched into the recombination layer 1.

Preferably, however, the regions 13 of reduced recombination probability are realized by the recombination layer 1 being altered in structure or composition in these regions 13. For example, the quantum well 1a is interrupted in the regions 13. This can be realized, for example, by means of implantation of ions or by diffusion of atoms.

Figure 4:
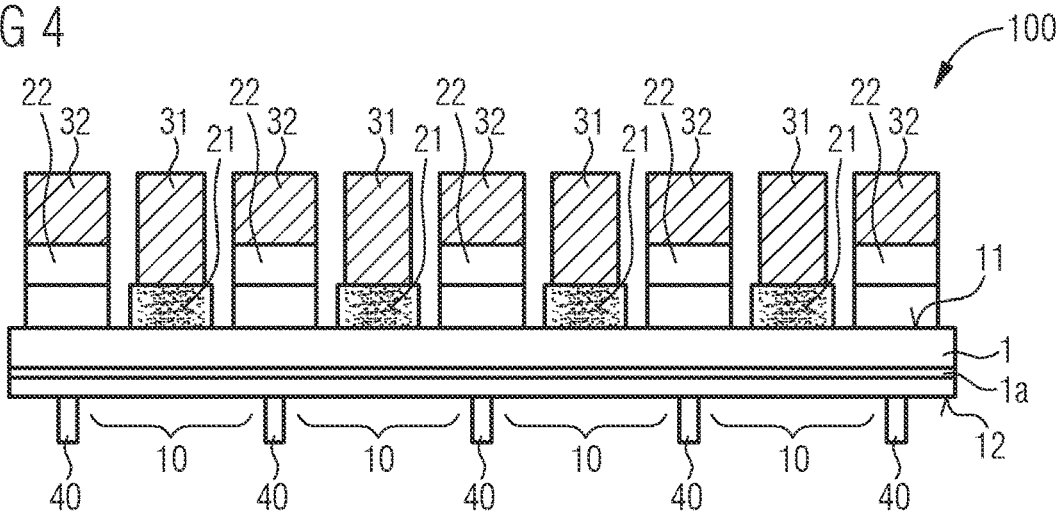

In FIG. 4, a fourth exemplary embodiment of the optoelectronic semiconductor chip 100 is shown. On the second side 12 of the recombination layer 1 opposite the first side 11 of the recombination layer 1, dividing walls 40 are provided in the region between each of the two adjacent first contact elements 31 and between each of the two adjacent pixels 10, respectively. The dividing walls 40 are, for example, reflective for the radiation generated in the recombination layer 1. The dividing walls 40 can further improve a contrast ratio between adjacent pixels 10.

The dividing walls 40 are preferably made of an opaque material, in particular a reflective and non-absorbing or non-significant absorbing material, for example a metal such as silver, aluminum or chromium. Alternatively, absorbing materials, such as a semiconductor material, for example silicon or GaN, may be used for the dividing walls 40. For example, a patterned semiconductor material may be used in which, in addition, a slope of side surfaces of the dividing walls 40 is adjustable. For example, the dividing walls 40 may narrow in a direction away from the second side 12. The dividing walls 40 may be superimposed on the recombination layer 1 or may be integral with the recombination layer 1.

Furthermore, it can be seen in FIG. 4 that the first connection regions 21 are no longer part of a simply connected first semiconductor layer 2. Rather, the first connection regions 21 are separate and spaced apart elements. For example, the first semiconductor layer 2 shown in the preceding figures has been patterned for this purpose. A remainder of the second semiconductor layer 2, which comprises a lower doping concentration than the second connection region 22, is then arranged between the second connection region 22 and the second contact element 32.

Figure 5:
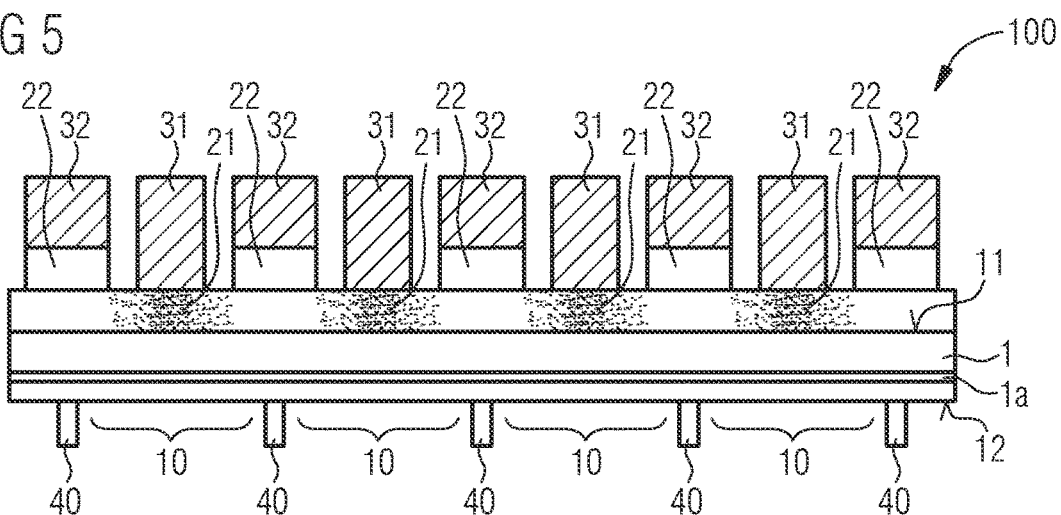

By designing the first connection regions 21 as spaced apart and separated elements, recombination of charge carriers outside the recombination layer 1 can be suppressed. In the fifth exemplary embodiment of the optoelectronic semiconductor chip 100 of FIG. 5, on the other hand, the first semiconductor layer 2 is again adapted to be continuous. Here, recombination of charge carriers in the first semiconductor layer 2 is suppressed by reducing the conductivity of the first semiconductor layer 2 in the region between the first contact elements 31 and the second contact element 32. For example, in these regions the first semiconductor layer 2 is locally nominally undoped or provided with a very low doping concentration. The conductivity for electrons and holes in these regions is, for example, lower than in the region below the first contact elements 31 and the second contact element 32.

Figure 6:
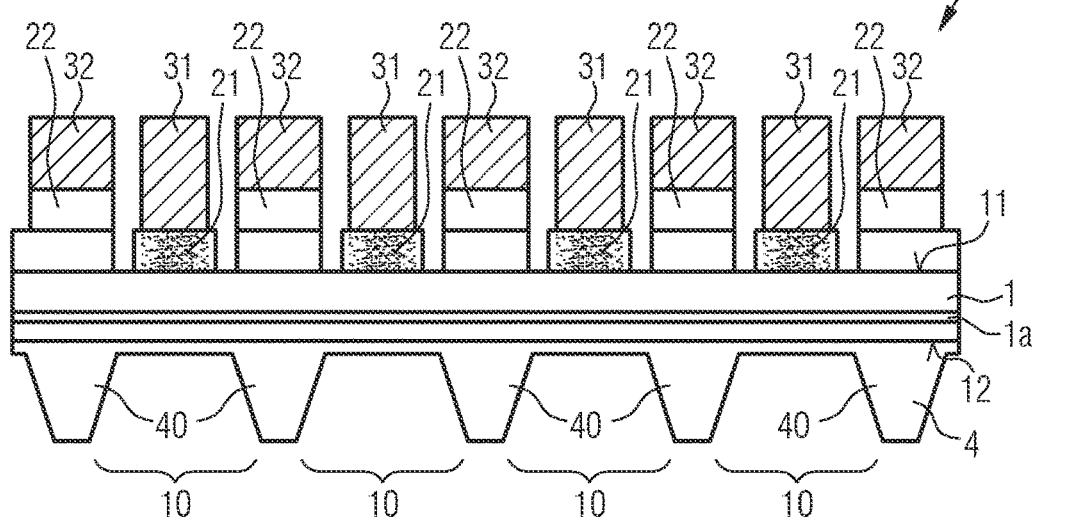

In FIG. 6, a sixth exemplary embodiment of the optoelectronic semiconductor chip 100 is shown. Again, dividing walls 40 are provided between adjacent pixels 10 on the second side 12 of the recombination layer 1. In the present embodiment, the dividing walls 40 are formed of a second semiconductor layer 4. The second semiconductor layer 4 is partially removed in the region of the first contact elements 31, so that recesses extend from a side of the second semiconductor layer 4 facing away from the recombination layer 1 toward the recombination layer 1. The recesses are laterally surrounded by the dividing walls 40.

Figure 7:
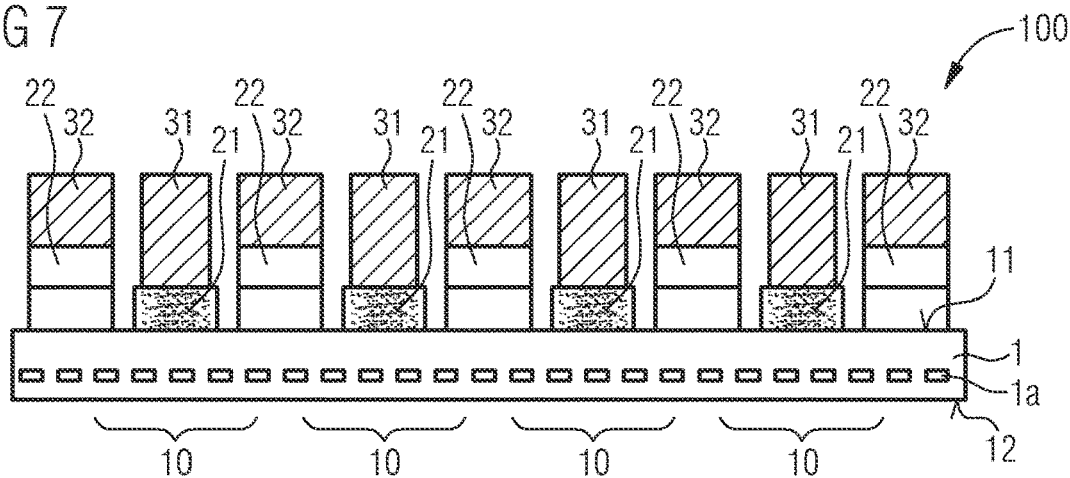

In FIG. 7, a seventh exemplary embodiment of the optoelectronic semiconductor chip 100 is shown. In the present embodiment, unlike the previous exemplary embodiments, a plurality of 0-dimensional quantum dots 1a are used instead of a 2-dimensional quantum well 1a. The density of the quantum dots 1a may vary along the lateral direction, for example. More radiation is then generated in regions of higher density than in the region of low density. Thus, the position of the radiation emitting regions of the recombination layer 1 can be further adjusted.

Figure 8:
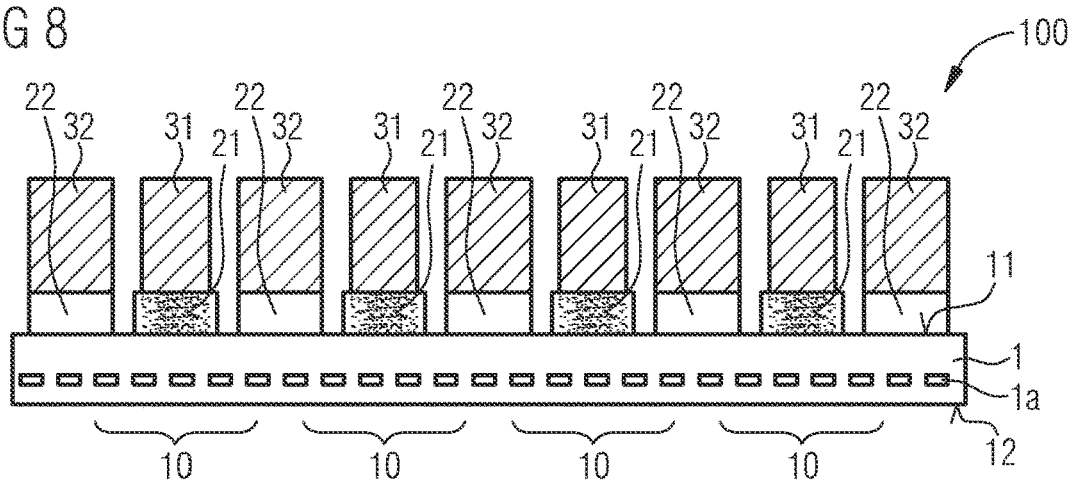

In FIG. 8, an eighth exemplary embodiment of the optoelectronic semiconductor chip 100 is shown. Here, the second connection region 22 is also directly adjacent to the recombination layer 1. For example, the first connection regions 21 and the second connection region 22 are grown by selective area growth.

Figure 9:
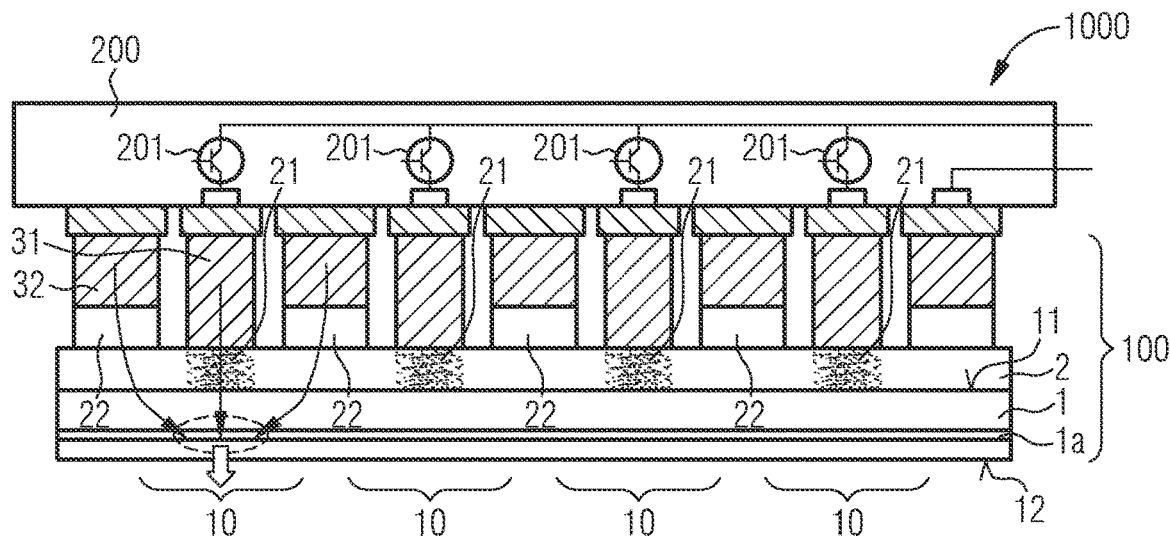

FIG. 9 shows an exemplary embodiment of an optoelectronic component 1000. The optoelectronic component 1000 comprises an optoelectronic semiconductor chip 100, in this case the optoelectronic semiconductor chip 100 of FIG. 1, but any other semiconductor chip 100 of FIGS. 2 to 8 could also be used. The semiconductor chip 100 is mounted on a carrier 200 and electrically connected. The carrier 200 is, for example, a silicon carrier with integrated switches 201. The carrier 200 comprises connection pads which are electrically conductively connected with contact elements 31, 32. Thereby, a switch 201 of the carrier 200 is biuniquely assigned to each first contact element 31. The switches 201 are, for example, thin-film transistors. By means of the switches 201, the first contact elements 31 can be energized individually and independently of each other.

Figure 10A:
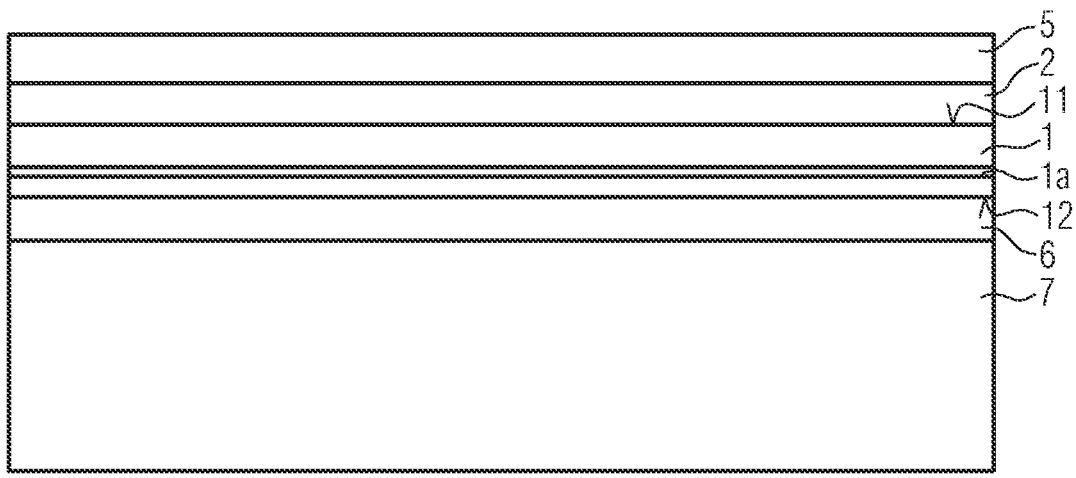

In FIG. 10A, a first position in an exemplary embodiment of the method for producing an optoelectronic semiconductor chip is shown. In this position, a semiconductor layer sequence comprising a recombination layer 1 with a quantum well 1a, a first semiconductor layer 2, and a third semiconductor layer 5 is provided. The layers are grown on a growth substrate 7 in this order and directly on top of each other. The growth substrate 7 is, for example, a GaAs substrate. The recombination layer 1 and the semiconductor layers 2, 5 are based on GaAs, for example. An etch stop layer 6 comprising, for example, an AlGaAs layer and an InGaAlP layer is arranged between the semiconductor layer sequence 1, 2, 5 and the growth substrate 7.

The first semiconductor layer 1 is nominally undoped or comprises a second type of doping, for example an n-type doping. Preferably, the doping concentration with the doping atoms of the second type is thereby at most $1 \cdot 10^{17}$ cm$^{-3}$.

The third semiconductor layer 5 also comprises a doping of the second type, for example an n-doping. Preferably, however, the doping concentration in the third semiconductor layer 5 is at least ten times as high as in the first semiconductor layer 2.

Figure 10B:
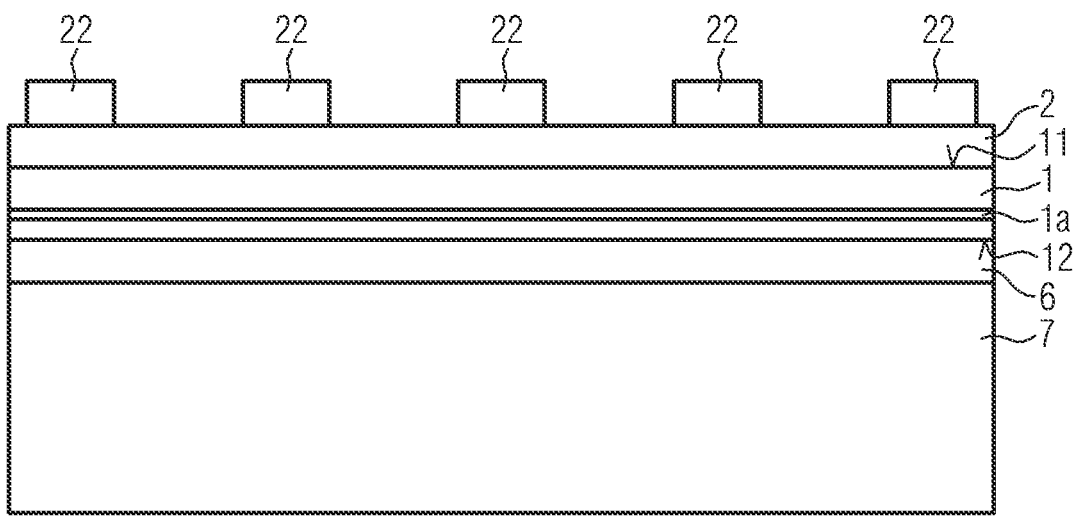

In FIG. 10B a second position of the method is shown, in which the third semiconductor layer 5 is patterned so that the third semiconductor layer 5 is removed in regions in which first connection regions are to be formed. What remains is a second connection region 22 from the third semiconductor layer 5. The structuring of the third semiconductor layer 5 is carried out, for example, by a lithography process.

Figure 10C:
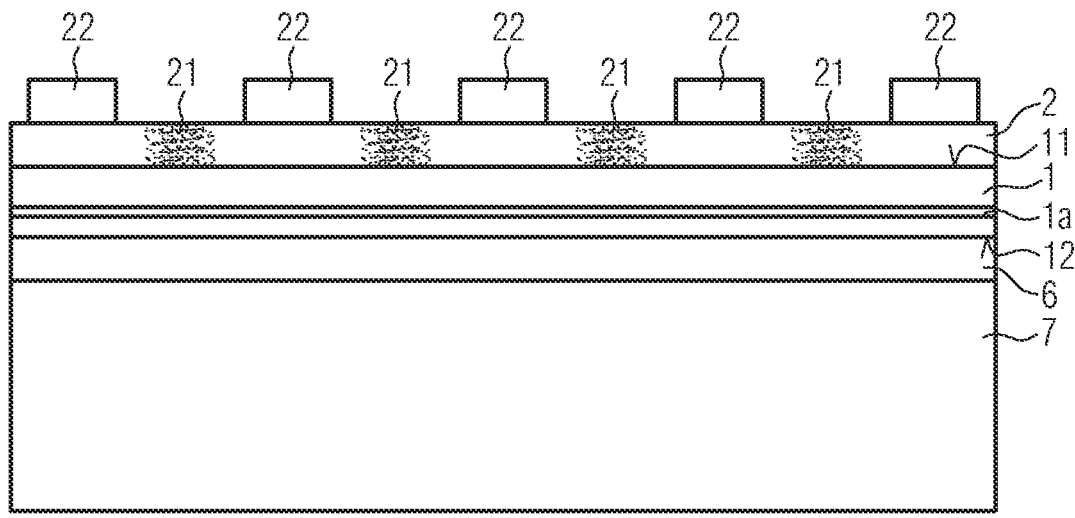

In FIG. 10C a third position of the method is shown, in which the first semiconductor layer 2 is doped in regions, for example by implantation or diffusion, so that first connection regions 21 are formed with a doping of a first type, presently a p-doping. For this purpose, zinc atoms, for example, have been introduced into the first semiconductor layer 2.

Figure 10D:
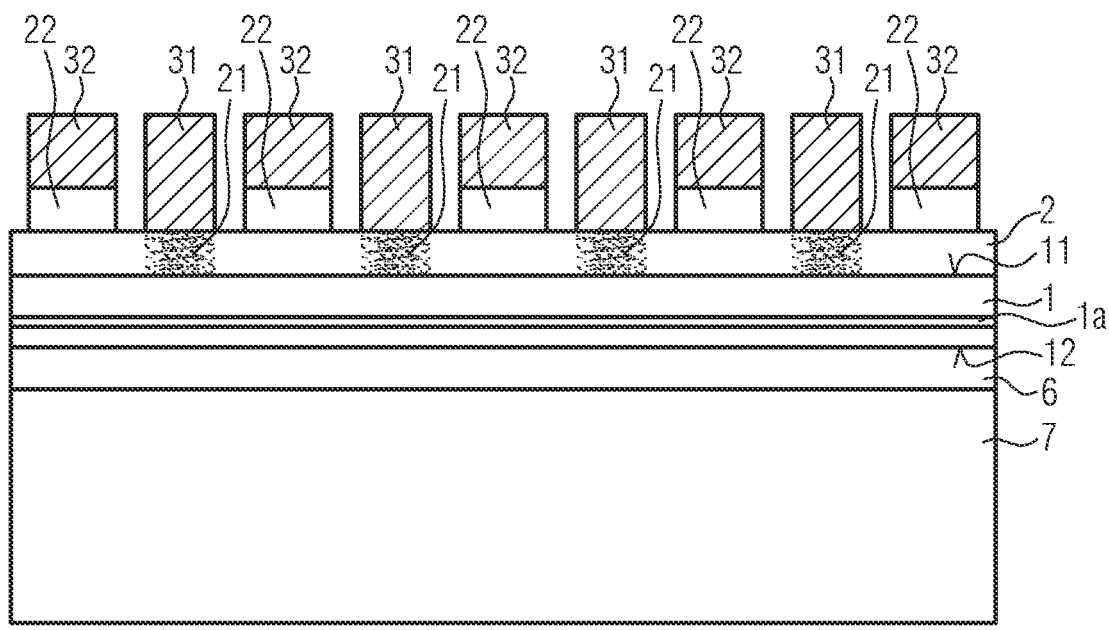

FIG. 10D shows a fourth position in the method, in which first contact elements 31 are applied to the first connection regions 21 and a second contact element 32 is applied to the second connection region 22. The contact elements 31, 32 are preferably applied directly to the associated connection regions 21, 22.

Figure 10E:
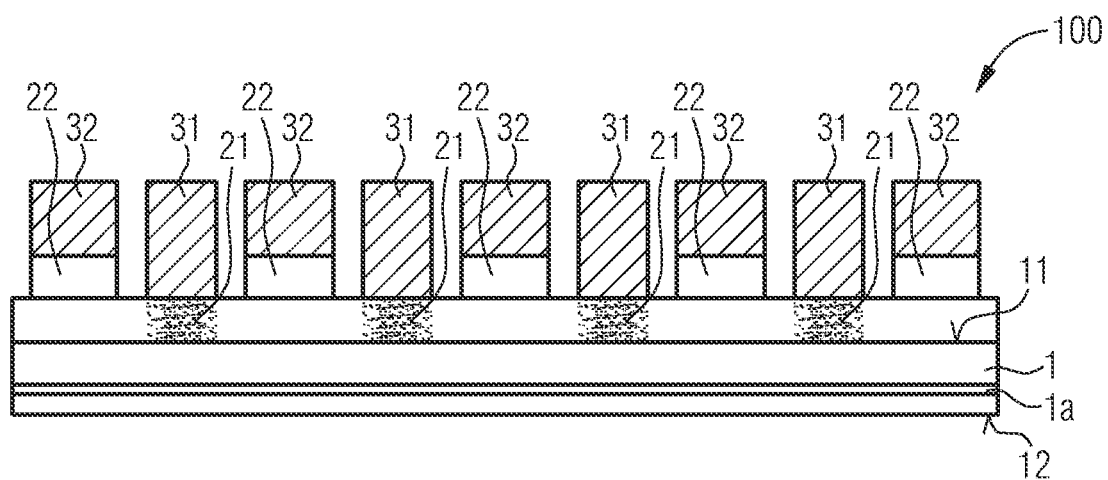

In FIG. 10E, a fifth position in the method is shown in which the growth substrate 7 is removed, for example by etching. In this case, the etch stop layer 6 has also been at least partially removed and has prevented penetration of the etchant into the recombination layer 1. FIG. 10E also shows an exemplary embodiment of a finished optoelectronic semiconductor chip 100.

The invention is not limited to the exemplary embodiments by the description thereof. Rather, the invention encompasses any new feature as well as any combination of features, which in particular includes any combination of features in the patent claims, even if these features or this combination itself is not explicitly specified in the patent claims or exemplary embodiments.

The invention claimed is:

1. An optoelectronic semiconductor chip comprising:
   a semiconducting recombination layer for generating radiation by charge carrier recombination;
   a plurality of first contact elements on a first side of the recombination layer;
   at least one second contact element on the first side of the recombination layer;
   a plurality of semiconducting first connection regions; and
   at least one semiconducting second connection region, wherein
   the first connection regions each are arranged between a first contact element and the first side of the recombination layer,
   the second connection region is arranged between the second contact element and the first side of the recombination layer,
   the first connection regions comprise a doping of a first type and the second connection region comprises a doping of a second type complementary to the doping of the first type,
   the first contact elements can be electrically contacted individually and independently of one another,
   the first connection regions are portions of a continuous, first semiconductor layer, and
   the first semiconductor layer is undoped or comprises a doping of a second type in regions between each of the two first connection regions, and
   a band gap in the first semiconductor layer is larger than in the recombination layer.

2. The optoelectronic semiconductor chip according to claim 1, wherein the first connection regions are spaced apart and separate elements from each other.

3. The optoelectronic semiconductor chip according to claim 1, wherein the second contact element is formed contiguous and penetrated by a plurality of holes, wherein, as viewed in a plan view, the first contact elements are each arranged in one such hole.

4. The optoelectronic semiconductor chip according to claim 1, wherein
the semiconductor chip comprises a plurality of second contact elements,
the first and second contact elements are arranged alternately side by side in a lateral direction.

5. The optoelectronic semiconductor chip according to claim 1, wherein the recombination layer comprises a plurality of 0-dimensional quantum wells.

6. The optoelectronic semiconductor chip according to claim 1, wherein the recombination layer comprises a patterning and/or a variation in structure along a lateral direction.

7. The optoelectronic semiconductor chip according to claim 1, wherein dividing walls are arranged on a second side of the recombination layer opposite the first side in the region between each of the two first contact elements.

8. The optoelectronic semiconductor chip according to claim 7, wherein a second semiconductor layer is arranged on the second side, wherein
the dividing walls are formed from the second semiconductor layer,
each first contact element is assigned a recess in the second semiconductor layer,
the recesses are each surrounded by the dividing walls in the lateral direction.

9. An optoelectronic component comprising:
an optoelectronic semiconductor chip according to claim 1,
a carrier on which the optoelectronic semiconductor chip is mounted and fixed, wherein
the optoelectronic semiconductor chip is electrically contacted via the carrier.

10. The optoelectronic component according to claim 9, wherein
the carrier comprises a plurality of switches,
each first contact element is associated with a switch, and
the associated first contact element is controllable via the switch.

11. A method for producing an optoelectronic semiconductor chip comprising:
A) providing a semiconducting recombination layer;
B) forming a plurality of semiconducting first connection regions and at least one semiconducting second connection region on a first side of the recombination layer, wherein the first connection regions comprise a first type of doping and the second connection region comprises a second type of doping complementary to the first type of doping;
C) applying a plurality of first contact elements and at least one second contact element to the first side of the recombination layer such that the first connection regions are each arranged between a first contact element and the first side of the recombination layer and the second connection region is arranged between the second contact element and the first side of the recombination layer, wherein the first contact elements are electrically contactable individually and independently of each other,
in step A), first a semiconductor layer sequence comprising the recombination layer and a first semiconductor layer on the first side of the recombination layer is provided, the first semiconductor layer is undoped or comprises a doping of a second type, and wherein
in step B), the first semiconductor layer is doped locally, such that the first connection regions with a doping of a first type are formed from the first semiconductor layer, and
a band gap in the first semiconductor layer is larger than in the recombination layer.

12. The method according to claim 11, wherein
in step A) first a semiconductor layer sequence is provided, which comprises the recombination layer and a third semiconductor layer on the first side of the recombination layer,
the third semiconductor layer comprises a doping of a second type,
in step B) the third semiconductor layer is patterned in such a way that, in the region where the first connection regions are to be formed, the third semiconductor layer is removed and at least one second connection region of the third semiconductor layer remains.

13. An optoelectronic semiconductor chip comprising:
a semiconducting recombination layer for generating radiation by charge carrier recombination;
a plurality of first contact elements on a first side of the recombination layer;
at least one second contact element on the first side of the recombination layer;
a plurality of semiconducting first connection regions; and
at least one semiconducting second connection region, wherein
the first connection regions each are arranged between a first contact element and the first side of the recombination layer,
the second connection region is arranged between the second contact element and the first side of the recombination layer,
the first connection regions comprise a doping of a first type and the second connection region comprises a doping of a second type complementary to the doping of the first type,
the first contact elements are electrically contacted individually and independently of one another, and
the optoelectronic semiconductor is a pixelated semiconductor chip with a plurality of individually and independently controllable pixels, wherein
each pixel is uniquely associated with a first contact element.

* * * * *